(12) United States Patent
Kidera et al.

(10) Patent No.: US 12,235,306 B2
(45) Date of Patent: Feb. 25, 2025

(54) ARC DETECTION DEVICE, ARC DETECTION SYSTEM, ARC DETECTION METHOD, AND RECORDING MEDIUM

(71) Applicant: Panasonic Intellectual Property Management Co., Ltd., Osaka (JP)

(72) Inventors: Kazunori Kidera, Osaka (JP); Tatsuo Koga, Osaka (JP); Takahiro Ohori, Osaka (JP); Keita Kanamori, Osaka (JP); Kazuya Ohshima, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 205 days.

(21) Appl. No.: 18/015,056

(22) PCT Filed: Jul. 20, 2021

(86) PCT No.: PCT/JP2021/027127
§ 371 (c)(1),
(2) Date: Jan. 7, 2023

(87) PCT Pub. No.: WO2022/044626
PCT Pub. Date: Mar. 3, 2022

(65) Prior Publication Data
US 2023/0305047 A1  Sep. 28, 2023

(30) Foreign Application Priority Data
Aug. 26, 2020  (JP) ................. 2020-142668

(51) Int. Cl.
*G01R 31/00*  (2006.01)

(52) U.S. Cl.
CPC ....................... *G01R 31/002* (2013.01)

(58) Field of Classification Search
CPC . G01R 31/002; G01R 31/086; G01R 31/1272
(Continued)

(56) References Cited

U.S. PATENT DOCUMENTS

| | | | |
|---|---|---|---|
| 6,777,953 B2 * | 8/2004 | Blades | G01R 1/07 324/532 |
| 11,644,498 B2 * | 5/2023 | Takami | G01R 31/14 324/551 |

(Continued)

FOREIGN PATENT DOCUMENTS

| | | |
|---|---|---|
| JP | 2011-7765 A | 1/2011 |
| JP | 2011-524601 A | 9/2011 |

(Continued)

OTHER PUBLICATIONS

European Search Report for corresponding European Patent Application No. 21861055.8 dated Feb. 8, 2024.

(Continued)

*Primary Examiner* — Giovanni Astacio-Oquendo
(74) *Attorney, Agent, or Firm* — Renner, Otto, Boisselle & Sklar, LLP

(57) ABSTRACT

An arc detection device includes an obtainer and a determiner. The obtainer obtains a measurement result for a voltage applied to one target power supply line among a plurality of power supply lines to which power is supplied from a DC power source. The determiner determines, based (Continued)

on a component of a specific frequency band in the measurement result for the voltage obtained by the obtainer, whether there is a possibility of an arc fault occurring in the plurality of power supply lines.

10 Claims, 5 Drawing Sheets

(58) Field of Classification Search
USPC .............................. 324/541, 539, 537, 500
See application file for complete search history.

(56) References Cited

U.S. PATENT DOCUMENTS

| | | | |
|---|---|---|---|
| 2006/0114627 A1 | 6/2006 | Wong | |
| 2008/0169824 A1* | 7/2008 | DeHaven | H02H 3/33 |
| | | | 324/555 |
| 2009/0206822 A1 | 8/2009 | Coumou | |
| 2009/0284265 A1 | 11/2009 | Ohta et al. | |
| 2011/0019444 A1 | 1/2011 | Dargatz et al. | |
| 2013/0335861 A1 | 12/2013 | Laschinski et al. | |
| 2014/0210485 A1 | 7/2014 | Lang et al. | |
| 2016/0181799 A1 | 6/2016 | Kanemaru et al. | |
| 2019/0079132 A1* | 3/2019 | Chine | G01R 31/1272 |
| 2019/0310298 A1* | 10/2019 | Bottman | H01B 7/328 |
| 2024/0248127 A1* | 7/2024 | Yahav | G01R 31/08 |

FOREIGN PATENT DOCUMENTS

| | | |
|---|---|---|
| JP | 2013-251981 A | 12/2013 |
| JP | 5369490 B | 12/2013 |
| JP | 5524335 B | 6/2014 |
| JP | 2014-134445 A | 7/2014 |
| JP | 5778787 B | 9/2015 |
| JP | 6000193 B | 9/2016 |
| JP | 6132919 B | 5/2017 |
| JP | 6164848 B | 7/2017 |
| JP | 6567230 B | 8/2019 |
| WO | 2009102358 A1 | 8/2009 |
| WO | 2011011711 A2 | 1/2011 |
| WO | 2012116722 A1 | 9/2012 |

OTHER PUBLICATIONS

International Search Report for corresponding Application No. PCT/JP2021/027127, mailed Oct. 12, 2021.
Written Opinion for corresponding Application No. PCT/JP2021/027127, mailed Oct. 12, 2021.

* cited by examiner

ARC DETECTION DEVICE, ARC DETECTION SYSTEM, ARC DETECTION METHOD, AND RECORDING MEDIUM

TECHNICAL FIELD

The present invention relates to an arc detection device, an arc detection system, an arc detection method, and a recording medium that determine whether there is a possibility of an arc fault occurring in a power supply line.

BACKGROUND ART

PTL 1 discloses an arc detection means for detecting an arc. This arc detection means includes a voltage detection means that measures a voltage value between input-side wiring to a terminal block and output-side wiring from the terminal block, and a current detection means that measures a current value in the output-side wiring from the terminal block. The arc detection means discriminates between electrical noise and the like and arcs at the terminal block by simultaneously detecting fluctuations in the voltage value in the voltage detection means and fluctuations in the current value in the current detection means.

CITATION LIST

Patent Literature

[PTL 1] Japanese Unexamined Patent Application Publication No. 2011-7765

SUMMARY OF INVENTION

Technical Problem

The present invention provides an arc detection device, an arc detection system, an arc detection method, and a recording medium capable of detecting the occurrence of an arc fault in a plurality of power supply lines branching from a DC power source.

Solution to Problem

An arc detection device according to one aspect of the present invention includes an obtainer and a determiner. The obtainer obtains a measurement result for a voltage applied to one target power supply line among a plurality of power supply lines to which power is supplied from a DC power source. The determiner determines, based on a component of a specific frequency band in the measurement result for the voltage obtained by the obtainer, whether there is a possibility of an arc fault occurring in the plurality of power supply lines.

An arc detection device according to one aspect of the present invention includes an obtainer and a determiner. The obtainer obtains a measurement result for a voltage applied to one target power supply line among a plurality of power supply lines to which power is supplied from a DC power source, and a measurement result for a current flowing in the one target power supply line. The determiner determines, based on a component of a specific frequency band of a product of (i) an instantaneous voltage in the measurement result for the voltage obtained by the obtainer and (ii) an instantaneous current in the measurement result for the current obtained by the obtainer, whether there is a possibility of an arc fault occurring in the plurality of power supply lines.

An arc detection system according to one aspect of the present invention includes the above-described arc detection device and the DC power source, the DC power source supplying power to the plurality of power supply lines.

An arc detection method according to one aspect of the present invention includes a step of obtaining and a step of determining. In the obtaining, a measurement result is obtained for a voltage applied to one target power supply line among a plurality of power supply lines to which power is supplied from a DC power source. In the determining, it is determined, based on a component of a specific frequency band in the measurement result for the voltage obtained in the obtaining, whether there is a possibility of an arc fault occurring in the plurality of power supply lines.

An arc detection method according to one aspect of the present invention includes a step of obtaining and a step of determining. In the obtaining, a measurement result is obtained for a voltage applied to one target power supply line among a plurality of power supply lines to which power is supplied from a DC power source, and a measurement result for a current flowing in the one target power supply line. In the determining, it is determined, based on a component of a specific frequency band of a product of (i) an instantaneous voltage in the measurement result for the voltage obtained in the obtaining and (ii) an instantaneous current in the measurement result for the current obtained in the obtaining, whether there is a possibility of an arc fault occurring in the plurality of power supply lines.

A recording medium according to one aspect of the present invention is a non-transitory computer-readable recording medium having recorded thereon a program that causes at least one processor to execute the above-described arc detection method.

Advantageous Effects of Invention

One aspect of the present invention has an advantage in that the occurrence of an arc fault in a plurality of power supply lines branching from a DC power source can be detected.

DESCRIPTION OF EMBODIMENTS

Figure 1:
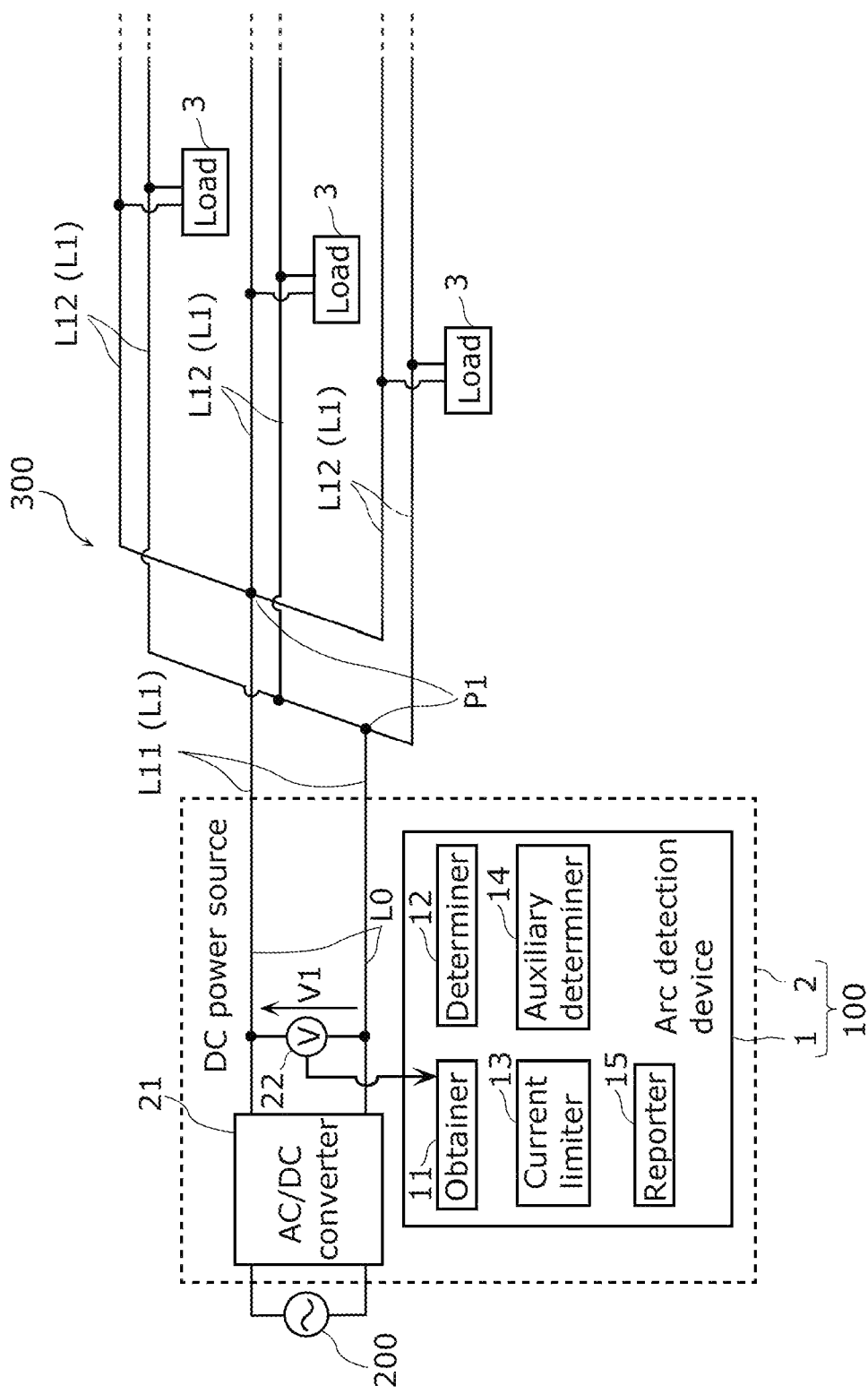
FIG. 1 is a schematic diagram illustrating the configuration of an arc detection system to which is applied an arc detection device according to Embodiment 1.

Embodiments of the present invention will be described hereinafter with reference to the drawings. The following embodiment describes a specific example of the present invention. As such, the numerical values, shapes, materials, constituent elements, arrangements and connection states of constituent elements, steps, orders of steps, and the like in the following embodiments are merely examples, and are not intended to limit the present invention.

Note also that the drawings are schematic diagrams, and are not necessarily exact illustrations. Also, configurations that are substantially the same are given the same reference signs in the drawings, and redundant descriptions will be omitted or simplified.

Embodiment 1

Configuration

An arc detection device and an arc detection system according to Embodiment 1 will be described with reference to FIG. 1. FIG. 1 is a schematic diagram illustrating the configuration of arc detection system 100 to which is applied arc detection device 1 according to Embodiment 1.

Arc detection device 1 is a device for determining whether there is a possibility of an arc fault occurring in a plurality of power supply lines L1 over which power is supplied from DC power source 2. In other words, power supply lines L1 may be damaged or broken by external factors, deterioration due to age, or the like, for example, and an arc (arc discharge) may occur due to such damage or the like, resulting in an arc fault. Accordingly, arc detection device 1 is used to detect arc faults which can occur in power supply lines L1. Here, "whether there is a possibility of an arc fault occurring" can include, in addition to whether an arc fault is currently occurring, whether an arc fault is not currently occurring but could occur in the near future.

Arc detection system 100 is constituted by arc detection device 1 and DC power source 2. In other words, arc detection system 100 includes arc detection device 1, and DC power source 2 which supplies power to the plurality of power supply lines L1.

Specifically, arc detection device 1 is used in what is known as direct current (DC) distribution network 300. In Embodiment 1, as illustrated in FIG. 1, DC distribution network 300 is configured including main power line L11 between DC power source 2 and branch point P1, and a plurality of branch lines L12 connected in parallel to branch point P1 and to each of which at least one load 3 is connectable. Main power line L11 and the plurality of branch lines L12 are all power supply lines L1. In other words, the plurality of power supply lines L1 include the plurality of branch lines L12 connected in parallel to branch point P1 and to each of which at least one load 3 is connectable.

Each power supply line L1 is constituted by a pair of power lines, namely a positive power supply line connected to a positive pole on an output side of DC power source 2 and a negative power supply line connected to a negative pole on the output side of DC power source 2. Accordingly, in Embodiment 1, branch point P1 is a combination of two points, namely a connection point between the positive power supply line of main power line L11 and the positive power supply line of each branch line L12, and a connection point between the negative power supply line of main power line L11 and the negative power supply line of each branch line L12.

Note that DC distribution network 300 may include a plurality of branch points P1 instead of one branch point P1. In this case, DC distribution network 300 includes a plurality of branch lines L12 for each branch point P1. Additionally, DC distribution network 300 may include a plurality of DC power sources 2 instead of one DC power source 2.

The following will assume that one DC power source 2 is included in DC distribution network 300, one branch point P1 is included in DC distribution network 300, and three branch lines L12 are connected to branch point P1, as illustrated in FIG. 1. In other words, DC distribution network 300 illustrated in FIG. 1 includes one main power line L11 and three branch lines L12, for a total of four power supply lines L1.

In Embodiment 1, DC power source 2 is a power conversion device including AC/DC converter 21. DC power source 2 converts AC power output from power system 200 into DC power, and outputs the resulting DC power to main power line L11. The DC power output to main power line L11 is output to each branch line L12 via branch point P1. Note that DC power source 2 may be in any form that outputs DC power, and may be a distributed power source such as a photovoltaic cell, a power source such as a storage battery, or a combination of these power sources and a power conversion device (e.g., a power conversion device having a DC/DC converter circuit).

Each branch line L12 is constituted by a duct rail, for example, and at least one load 3 is connectable thereto. In other words, at least one load 3 can be disposed at any position in each branch line L12. Of course, each branch line L12 may be in a form in which the positions to which the at least one load 3 is connectable are set in advance. In Embodiment 1, each branch line L12 is installed in a ceiling of a facility, but may instead be installed in a floor, a wall, a fixture, or the like in a facility.

By being connected to branch line L12, load 3 receives the DC power supplied from DC power source 2 via branch line L12, and is driven. In Embodiment 1, load 3 is a lighting fixture, but may instead be a speaker, a camera, a sensor, USB power delivery (USB PD), or the like, for example. In other words, load 3 may be a device aside from a lighting fixture as long as the device receives and is driven by DC power. Additionally, although all loads 3 connected to branch lines L12 are lighting fixtures and are one type in Embodiment 1, loads 3 connected to branch lines L12 may be of a plurality of types. For example, a lighting fixture, a speaker, a camera, a sensor, and a USB PD may be connected to branch lines L12. These devices may all be connected to a single branch line L12, or may be distributed among a plurality of branch lines L12.

Voltages of equivalent magnitudes are applied to each of the plurality of branch lines L12 from DC power source 2. Here, "equivalent" includes being perfectly identical as well as being almost identical. In other words, the voltages applied to each of the plurality of branch lines L12 are permitted to have an error of several percent with respect to each other. Additionally, currents which basically differ from each other according to the states of the at least one load 3 (that is, whether a power switch is on or off) connected to each branch line L12 flow in branch lines L12. Of course, depending on branch line L12, almost no current, or no current at all, may flow in branch line L12, such as when the power switches of all connected loads 3 are turned off.

As functional constituent elements for determining whether there is a possibility of an arc fault occurring, arc detection device 1 includes obtainer 11, determiner 12, current limiter 13, auxiliary determiner 14, and reporter 15. Arc detection device 1 is a microcomputer or a device including a microcomputer, for example. A microcomputer is a semiconductor integrated circuit or the like including ROM and RAM storing programs, a processor (central processing unit; CPU) that executes the programs, a timer, an A/D converter, a D/A converter, and the like. Obtainer 11, determiner 12, current limiter 13, auxiliary determiner 14, and reporter 15 are all implemented by the processor executing the programs.

Obtainer 11 obtains a measurement result for voltage V1 applied to one target power supply line L0 among the plurality of power supply lines L1 to which power is supplied from DC power source 2. In Embodiment 1, obtainer 11 obtains the measurement result for voltage V1 measured by voltmeter 22 sampling at a predetermined cycle (a sampling cycle). In other words, obtainer 11 obtains the measurement result for voltage V1 from voltmeter 22 at the predetermined cycle. Voltmeter 22 is provided in DC power source 2, and measures a line voltage between the positive power supply line and the negative power supply line of main power line L11 (i.e., voltage V1 applied to target power supply line L0).

Note that voltmeter 22 need not be provided in DC power source 2, and may be a device separate from DC power source 2. In this case, voltmeter 22 can also be provided not only in main power line L11, but also in any one of the plurality of branch lines L12. Accordingly, obtainer 11 obtains the measurement result for voltage V1 applied to any one power supply line L1 among main power line L11 and the plurality of branch lines L12, depending on the subject for the measurement by voltmeter 22.

Determiner 12 determines, based on a component in a specific frequency band in the measurement result for voltage V1 obtained by obtainer 11, whether there is a possibility of an arc fault occurring in the plurality of power supply lines L1. First and second examples of the determination by determiner 12 will be described hereinafter. In Embodiment 1, determiner 12 makes the determination according to one of the first determination example and the second determination example.

In the first determination example, determiner 12 performs a frequency analysis on the measurement result for voltage V1 obtained by obtainer 11. "Frequency analysis" refers to, for example, calculating the frequency spectrum of the measurement result for voltage V1 by performing a Fourier transform (here, a Fast Fourier Transform (FFT)) on the time waveform of the measurement result for voltage V1. Then, by referring to the calculated frequency spectrum, determiner 12 determines that there is a possibility of an arc fault occurring when the measurement result for voltage V1 includes a component of a specific frequency band. The specific frequency band is, for example, a band that includes the frequency of noise produced when an arc fault has occurred or when there is the possibility of an arc fault occurring. As one example, the specific frequency band is a band in the tens of kHz, which is a relatively high-frequency band. Note that the frequency of the noise produced in cases such as those mentioned above can be obtained experimentally.

In the second determination example, determiner 12 makes the determination by performing a normalization operation on the measurement result for voltage V1 obtained by obtainer 11, and then performing frequency analysis on the normalized measurement result for voltage V1. In other words, determiner 12 determines whether there is the possibility of an arc fault occurring in the plurality of power supply lines L1 based on a value normalized to extract the component of the specific frequency band in the measurement result obtained by obtainer 11 (here, the measurement result for voltage V1). Normalizing the measurement result for voltage V1 makes it possible for determiner 12 to focus the frequency analysis on a change in voltage V1 which can arise when there is a possibility of an arc fault occurring. As a result, the resolution of operations required for the determination can be improved, the dynamic range can be limited to the component of the specific frequency band to improve the gain, and the like, which can be expected to improve the accuracy of the determination by determiner 12.

Examples of operations performed by determiner 12 to normalize the measurement result for voltage V1 will be given below. In Embodiment 1, determiner 12 normalizes the measurement result for voltage V1 according to any one of the following operation examples. Note that determiner 12 may normalize the measurement result for voltage V1 through a method different from the following operation examples to extract a component of the specific frequency band from the measurement result for voltage V1.

In a first operation example, determiner 12 normalizes the measurement result for voltage V1 by dividing an instantaneous voltage, in the measurement result for voltage V1 obtained by obtainer 11, by a moving average voltage. The moving average voltage is, for example, an unweighted average (i.e., a simple moving average) of the most recent n instantaneous voltages (where "n" is a natural number). In the first operation example, the operational load is greater than in the second operation example and third operation example described below, but only changes in the ratio of measurement results for voltage V1 can be captured, which can be expected to improve the accuracy of the determination by determiner 12.

In the second operation example, determiner 12 normalizes the measurement result for voltage V1 by subtracting the moving average voltage from the instantaneous voltage in the measurement result for voltage V1 obtained by obtainer 11. The moving average voltage is calculated through operations similar to those in the first operation example. In the second operation example, the frequency analysis can be performed using a value obtained by removing a DC component from the measurement result for voltage V1, which makes it possible to obtain a broader dynamic range for the component of the specific frequency band, and as a result, an improvement in the accuracy of the determination by determiner 12 can be expected.

In the third operation example, determiner 12 normalizes the measurement result for voltage V1 by subtracting the instantaneous voltage in one sample previous from the instantaneous voltage in the measurement result for voltage V1 obtained by obtainer 11. Similar to the second operation example, in the third operation example, the frequency analysis can be performed using a value obtained by removing a DC component from the measurement result for voltage V1, which makes it possible to obtain a broader dynamic range for the component of the specific frequency band, and as a result, an improvement in the accuracy of the determination by determiner 12 can be expected. The third operation example has an additional advantage in that the operational load is smaller than in the first operation example and the second operation example.

As described above, when an arc fault has occurred, or there is a possibility of an arc fault occurring, in one power supply line L1 among the plurality of power supply lines L1, a component of a specific frequency band appears in the measurement result for voltage V1, which makes it possible to determine that there is a possibility of an arc fault occurring. However, there are other factors that can cause voltage V1 applied to power supply line L1 to change aside from the occurrence of arc faults, such as noise from external disturbances, and it is therefore necessary to determine whether an arc fault has actually occurred. Accordingly, in Embodiment 1, arc detection device 1 determines whether an arc fault is actually occurring by using current limiter 13 and auxiliary determiner 14. In other words, in Embodiment 1, a first determination is made by determiner 12, and a second determination is made by auxiliary determiner 14.

Current limiter 13 temporarily reduces current flowing in the plurality of power supply lines L1 when determiner 12 determines that there is the possibility of an arc fault occurring. In Embodiment 1, current limiter 13 temporarily stops the current flowing in the plurality of power supply lines L1 when determiner 12 determines that there is the possibility of an arc fault occurring. As a result, when arc discharge is produced due to an arc fault, the arc discharge is extinguished.

For example, current limiter 13 temporarily stops current flowing in main power line L11, i.e., the current flowing in the plurality of power supply lines L1, by controlling a switch connected to main power line L11. The switch is, for example, a mechanical switch or a semiconductor switch. The mechanical switch is a switch such as a relay or a breaker, and the semiconductor switch is a switch such as a transistor or a diode, for example.

Note that the switch connected to main power line L11 may be a switch connected directly to main power line L11, or may be a switch connected indirectly to main power line L11. For example, the switch is a switch for implementing an AC/DC conversion function in AC/DC converter 21. Even if not connected directly to main power line L11, the switch is connected to main power line L11 indirectly, and is therefore a switch connected to main power line L11. For example, current limiter 13 temporarily stops the current flowing in main power line L11 by controlling the switch to temporarily stop switching operations of the switch. Then, current limiter 13 lifts the temporary stop of the current flowing in main power line L11 after a predetermined time (e.g., approximately 1 second) has passed following the stop of the current flowing in main power line L11. In other words, current limiter 13 controls the switch and turns on the AC/DC conversion function (in other words, attempts to send current through main power line L11 (i.e., the plurality of power supply lines L1) again). Note that the predetermined time is not particularly limited, and may be determined as appropriate.

Note that the switch may be configured to switch DC power source 2 on and off. In this case, current limiter 13 temporarily stops the current flowing in main power line L11 by controlling the switch and temporarily turning DC power source 2 off. Then, after the predetermined time has passed following the stop of the current flowing in main power line L11, current limiter 13 lifts the temporary stop of the current flowing in main power line L11 by controlling the switch and turning DC power source 2 on.

Additionally, the switch may be provided in main power line L11, and the switch may be configured to switch main power line L11 between open and closed. For example, current limiter 13 may temporarily stop the current flowing in main power line L11 by controlling the switch and opening main power line L11. Then, after the predetermined time has passed following the stop of the current flowing in main power line L11, current limiter 13 lifts the temporary stop of the current flowing in main power line L11 by controlling the switch and closing main power line L11.

Auxiliary determiner 14 determines, after current limiter 13 stops temporarily reducing the current flowing in the plurality of power supply lines L1, whether an arc fault is occurring in the plurality of power supply lines L1. Specifically, auxiliary determiner 14 determines whether an arc fault is occurring based on the measurement result for voltage V1 obtained by obtainer 11 after the temporary stop on the current flowing in main power line L11 has been lifted. For example, auxiliary determiner 14 determines that an arc fault has occurred when the instantaneous voltage in the measurement result for voltage V1 is less than a predetermined value. The predetermined value is, for example, an instantaneous voltage in a normal state where no arc fault is occurring. In other words, auxiliary determiner 14 determines, based on a direct current component in the measurement result for voltage V1 obtained by obtainer 11, whether there is a possibility of an arc fault occurring in the plurality of power supply lines L1.

When an arc fault is occurring in any one of power supply lines L1, that power supply line L1 is disconnected or semi-disconnected due to the arc fault, and thus no current or almost no current will flow in that power supply line L1 even if the temporary stop of the current flowing in main power line L11 is lifted. As such, when an arc fault is occurring in any one of power supply lines L1, the instantaneous voltage will differ from the voltage in the normal state, and will be an anomalous voltage (e.g., less than the predetermined value). In other words, auxiliary determiner 14 can determine whether an arc fault is occurring based on the instantaneous voltage (i.e., the direct current component) in the measurement result for voltage V1 obtained by obtainer 11.

Reporter 15 makes a report to the surrounding area that there is a possibility of an arc fault occurring by, for example, lighting a lamp, sounding a buzzer, or the like. Reporter 15 may make a report that there is a possibility of an arc fault occurring by transmitting information to that effect to an information terminal owned by an owner, a manager, or the like of arc detection system 100. Examples of the information terminal can include a mobile terminal such as a smartphone or a tablet, a personal computer, or the like.

Operations

Figure 2:
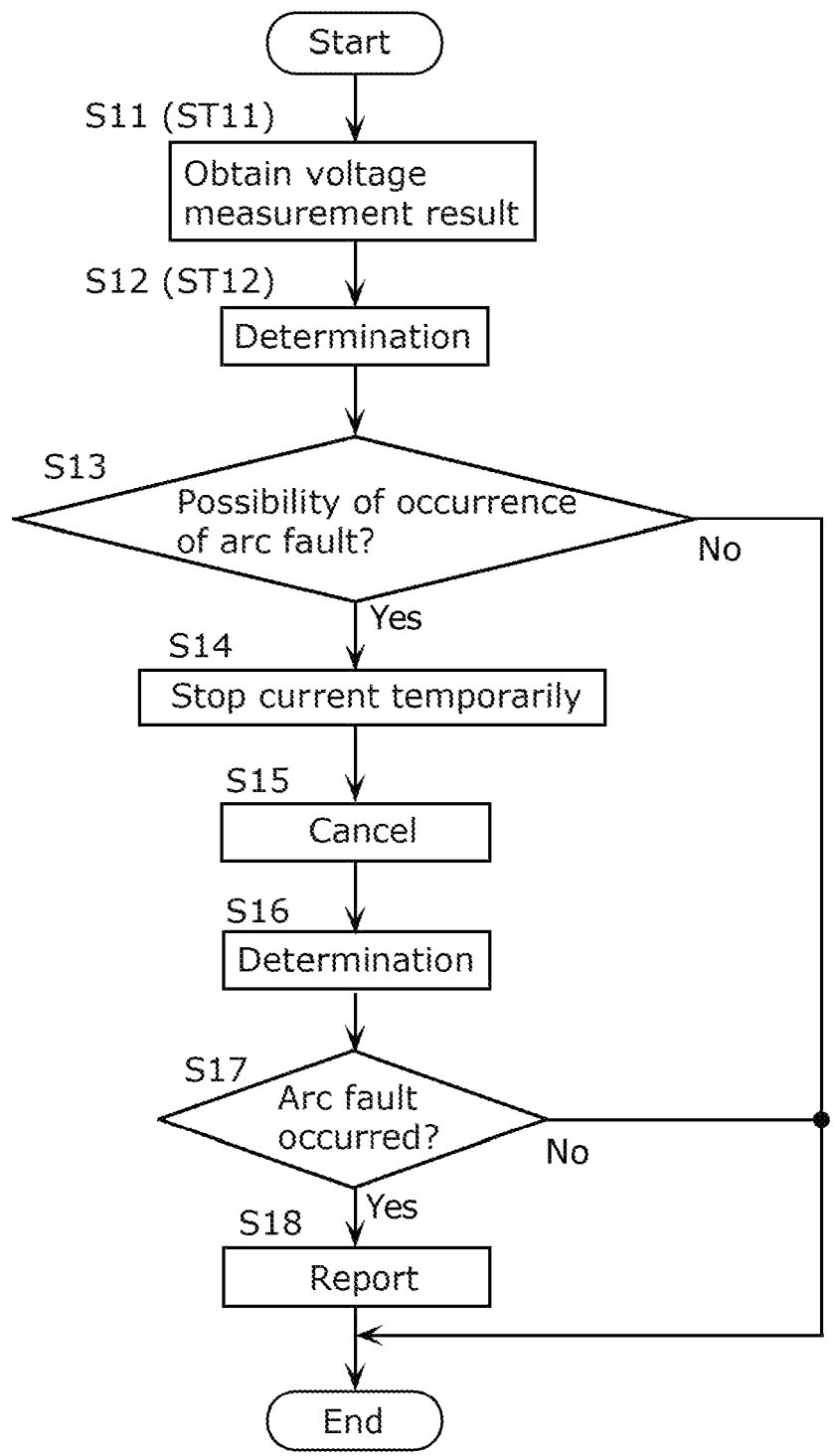
FIG. 2 is a flowchart illustrating an example of operations performed by the arc detection device according to Embodiment 1.

An example of operations performed by arc detection device 1 according to Embodiment 1 will be described next with reference to FIG. 2. FIG. 2 is a flowchart illustrating an example of operations performed by arc detection device 1 according to Embodiment 1. The following assumes that determiner 12 makes the determination according to the first determination example.

First, obtainer 11 obtains the measurement result for voltage V1 from voltmeter 22 at the predetermined cycle (S11). Process S11 corresponds to obtainment step ST11 of an arc detection method. Then, determiner 12 determines, based on a component of a specific frequency band in the measurement result for voltage V1 obtained by obtainer 11, whether there is a possibility of an arc fault occurring in the plurality of power supply lines L1 (S12). Here, determiner 12 makes the determination by performing a frequency analysis on the measurement result for voltage V1 obtained by obtainer 11. Process S12 corresponds to determination step ST12 of the arc detection method.

When determiner 12 determines that there is the possibility of an arc fault occurring (S13: Yes), current limiter 13 temporarily reduces current flowing in the plurality of power supply lines L1 (S14). On the other hand, when determiner 12 determines that there is no possibility of an arc fault occurring (S13: No), the processing by arc detection device 1 ends. Then, current limiter 13 lifts the temporary stop of the current flowing in the plurality of power supply lines L1 after the predetermined time has passed following the stop of the current flowing in the plurality of power supply lines L1 (S15). Thereafter, auxiliary determiner 14 determines, based on the measurement result for voltage V1 obtained by obtainer 11, whether an arc fault is occurring in the plurality of power supply lines L1 (S16).

When auxiliary determiner 14 determines that an arc fault is occurring (S17: Yes), reporter 15 makes a report of the occurrence of the arc fault (S18). On the other hand, when auxiliary determiner 14 determines that an arc fault is not occurring (S17: No), the processing by arc detection device 1 ends. The above series of processes S11 to S18 is then repeated.

Advantages

Advantages of arc detection device 1 according to Embodiment 1 will be described next. Arc detection device 1 according to Embodiment 1 determines whether there is a possibility of an arc fault occurring based on a component of a specific frequency band in a measurement result for voltage V1 applied to any one target power supply line L0 among the plurality of power supply lines L1. As such, arc detection device 1 according to Embodiment 1 can determine whether there is a possibility of an arc fault occurring not only in target power supply line L0, but also in other power supply lines L1 as well. Therefore, arc detection device 1 according to Embodiment 1 has an advantage of being able to detect the occurrence of an arc fault in the plurality of power supply lines L1 branching from DC power source 2.

Advantages of arc detection device 1 according to Embodiment 1 will be described here through a comparison with an arc detection device of a comparative example. The arc detection device of the comparative example differs from arc detection device 1 according to Embodiment 1 in that whether there is a possibility of an arc fault occurring is determined based on a measurement result for current flowing in target power supply line L0.

The arc detection device of the comparative example has a problem in that whether there is a possibility of an arc fault occurring in target power supply line L0 cannot be determined when no current is flowing in target power supply line L0 due to, for example, all loads 3 connected to target power supply line L0 being turned off or the like. The arc detection device of the comparative example also has a problem in that whether there is a possibility of an arc fault occurring in power supply lines L1 aside from target power supply line L0 cannot be determined, and the arc detection device of the comparative example would need to be provided for each power supply line L1 to make such determinations.

In contrast, arc detection device 1 according to Embodiment 1 makes the determination based on the measurement result for voltage V1 applied to target power supply line L0, and thus whether there is a possibility of an arc fault occurring in target power supply line L0 can be determined even when no current is flowing in target power supply line L0. Additionally, arc detection device 1 according to Embodiment 1 can determine whether there is a possibility of an arc fault occurring not only in target power supply line L0, but also in other power supply lines L1 as well. This is because when an arc fault has occurred, or there is a possibility of an arc fault occurring, in any one of power supply lines L1 aside from target power supply line L0, not only does noise arise in the voltage applied to that power supply line L1, but similar noise also arises in the voltages applied to other power supply lines L1. Accordingly, with arc detection device 1 according to Embodiment 1, arc detection device 1 only need be provided in one power supply line L1 (target power supply line L0) among the plurality of power supply lines L1, and need not be provided for each power supply line L1. Furthermore, arc detection device 1 according to Embodiment 1 has an advantage in that because arc detection device 1 only need be provided in one power supply line L1 (target power supply line L0) among the plurality of power supply lines L1, and the location thereof is not limited, there is a high degree of freedom in terms of installation.

Figure 3:
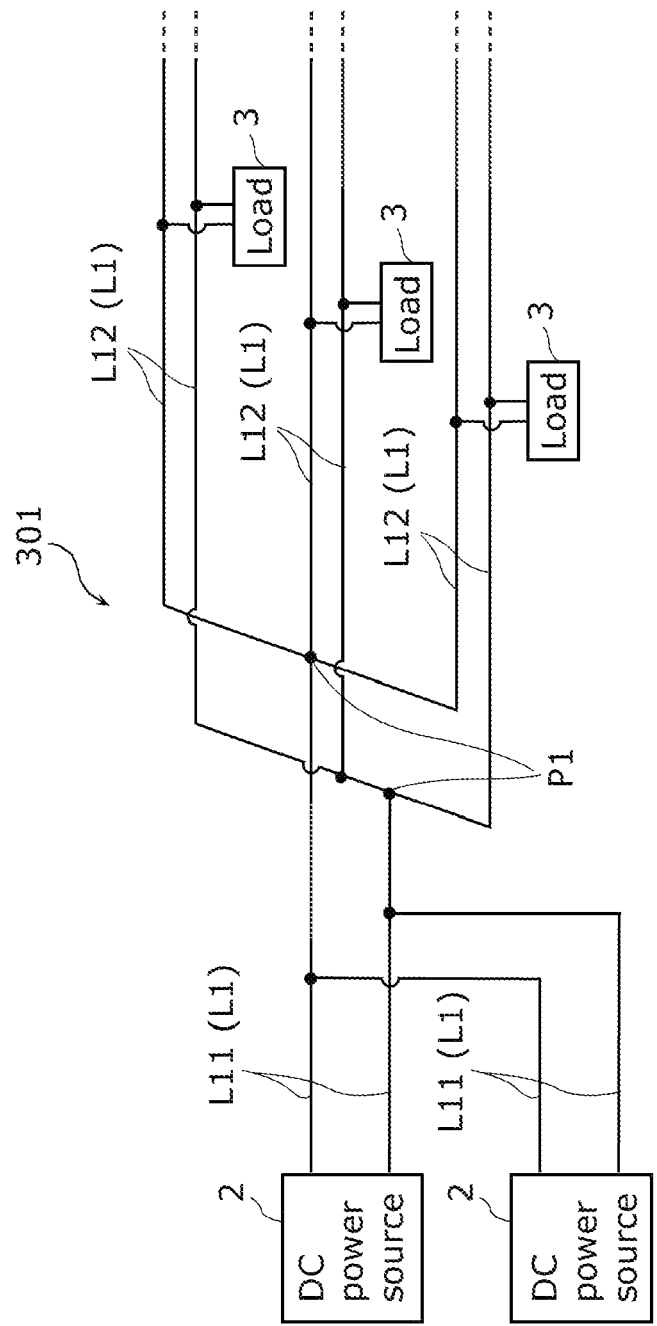
FIG. 3 is a schematic diagram illustrating an example of a DC distribution network having two DC power sources.

Examples in which arc detection device 1 according to Embodiment 1 is installed in DC distribution network 300 illustrated in FIG. 1, and in DC distribution network 301 illustrated in FIG. 3, will be described hereinafter. FIG. 3 is a schematic diagram illustrating an example of DC distribution network 301 having two DC power sources 2. In DC distribution network 301 illustrated in FIG. 3, two DC power sources 2 are connected in parallel to branch point P1. In other words, DC distribution network 301 illustrated in FIG. 3 includes two main power lines L11 and three branch lines L12, for a total of five power supply lines L1. Note that arc detection device 1 and power system 200 are not shown in FIG. 3.

With DC distribution network 300 illustrated in FIG. 1, arc detection device 1 can be installed in any of the one main power line L11 and three branch lines L12. Assume, for example, that arc detection device 1 is installed in one branch line L12 among the three branch lines L12. In this case, arc detection device 1 can determine that an arc fault has occurred regardless of whether the arc fault occurs in main power line L11 or another branch line L12.

Figure 5:
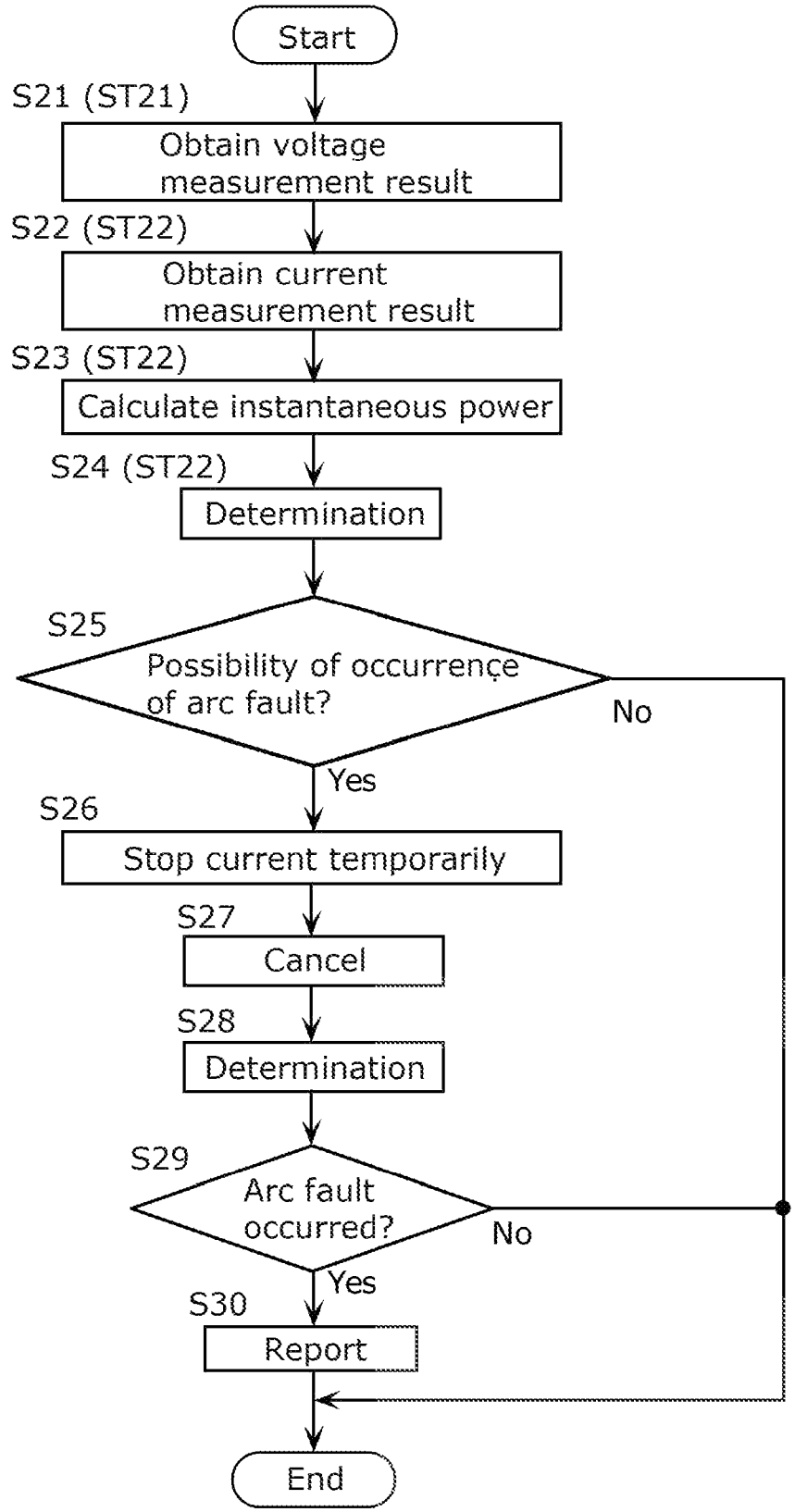
FIG. 5 is a flowchart illustrating an example of operations performed by the arc detection device according to Embodiment 2.

With DC distribution network 301 illustrated in FIG. 5, arc detection device 1 can be installed in any of the two main power lines L11 and three branch lines L12. Assume, for example, that arc detection device 1 is Installed in one main power line L11 among the two main power lines L11. In this case, arc detection device 1 can determine that an arc fault has occurred regardless of whether the arc fault occurs in the other main power line L11 or another of the three branch lines L12.

Embodiment 2

Configuration

Figure 4:
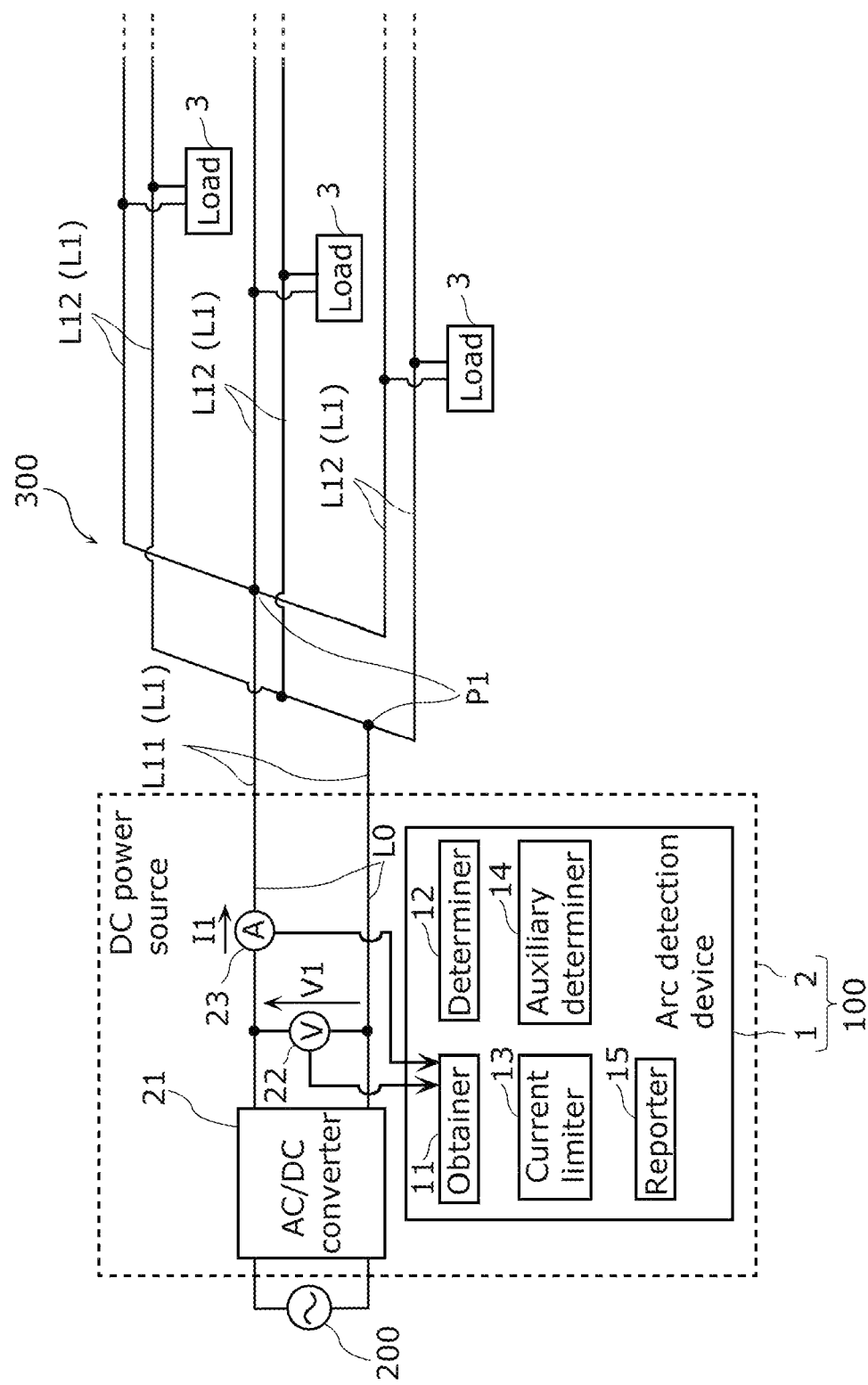
FIG. 4 is a schematic diagram illustrating the configuration of an arc detection system to which is applied an arc detection device according to Embodiment 2.

An example of arc detection device 1 according to Embodiment 2 will be described next with reference to FIG. 4. FIG. 4 is a schematic diagram illustrating the configuration of arc detection system 100 to which is applied arc detection device 1 according to Embodiment 2. Arc detection device 1 according to Embodiment 2 differs from arc detection device 1 according to Embodiment 1 in that whether there is a possibility of an arc fault occurring is determined based on a measurement result for power supplied to target power supply line L0. The following will mainly describe differences from Embodiment 1, and descriptions of points common with Embodiment 1 will be omitted as appropriate.

In Embodiment 2, obtainer 11 further obtains a measurement result for current I1 flowing in target power supply line L0. In Embodiment 2, obtainer 11 obtains the measurement result for current I1 measured by ammeter 23 sampling at a predetermined cycle (a sampling cycle). In other words, obtainer 11 obtains the measurement result for current I1 from ammeter 23 at the predetermined cycle. This predetermined cycle may be the same as the predetermined cycle used when obtaining the measurement result for voltage V1 from voltmeter 22. Ammeter 23 is provided in DC power source 2, and measures current flowing in the positive power supply line of main power line L11 (i.e., current I1 flowing in target power supply line L0).

In Embodiment 2, determiner 12 determines, based on a component of a specific frequency band of a product of (i) an instantaneous voltage in the measurement result for voltage V1 obtained by obtainer 11 and (ii) an instantaneous current in the measurement result for current I1 obtained by obtainer 11, whether there is a possibility of an arc fault occurring in the plurality of power supply lines L1. Specifically, determiner 12 obtains an instantaneous power supplied to target power supply line L0 by calculating the product of (i) the instantaneous voltage in the measurement result for voltage V1 obtained by obtainer 11 and (ii) the instantaneous current in the measurement result for current I1 obtained by obtainer 11. Then, determiner 12 performs frequency analysis on the instantaneous power obtained from the calculation, and determines that there is a possibility of an arc fault occurring when the instantaneous power includes a component of a specific frequency band.

Note that determiner 12 may execute an operation for normalizing the measurement result for the instantaneous voltage and the measurement result for the instantaneous current obtained by obtainer 11, and then calculate the product of the normalized instantaneous voltage and instantaneous current. In other words, determiner 12 may determine whether there is the possibility of an arc fault occurring in the plurality of power supply lines L1 based on a value normalized to extract the component of the specific frequency band in the measurement results obtained by obtainer 11 (here, the measurement result for voltage V1 and the measurement result for current I1). For examples of operations for normalizing the measurement result for current I1, "voltage" may be replaced with "current" in each of the first to third operation examples described in Embodiment 1.

Operations

An example of operations performed by arc detection device 1 according to Embodiment 2 will be described next with reference to FIG. 5. FIG. 5 is a flowchart illustrating an example of operations performed by arc detection device 1 according to Embodiment 2.

First, obtainer 11 obtains the measurement result for voltage V1 from voltmeter 22 at the predetermined cycle (S21). Obtainer 11 also obtains the measurement result for current I1 from ammeter 23 at the predetermined cycle (S22). Processes S21 and S22 correspond to obtainment step ST21 of an arc detection method.

Next, determiner 12 obtains the instantaneous power supplied to target power supply line L0 by calculating the product of (i) the instantaneous voltage in the measurement result for voltage V1 obtained by obtainer 11 and (ii) the instantaneous current in the measurement result for current I1 obtained by obtainer 11 (S23). Then, determiner 12 determines whether there is a possibility of an arc fault occurring in the plurality of power supply lines L1 by performing frequency analysis on the instantaneous power obtained from the calculation (S24). Processes S23 and S24 correspond to determination step ST22 of the arc detection method.

When determiner 12 determines that there is the possibility of an arc fault occurring (S25: Yes), current limiter 13 temporarily reduces current flowing in the plurality of power supply lines L1 (S26). On the other hand, when determiner 12 determines that there is no possibility of an arc fault occurring (S25: No), the processing by arc detection device 1 ends. Then, current limiter 13 lifts the temporary stop of the current flowing in the plurality of power supply lines L1 after the predetermined time has passed following the stop of the current flowing in the plurality of power supply lines L1 (S27). Thereafter, auxiliary determiner 14 determines, based on the measurement result for voltage V1 obtained by obtainer 11, whether an arc fault is occurring in the plurality of power supply lines L1 (S28).

When auxiliary determiner 14 determines that an arc fault is occurring (S29: Yes), reporter 15 makes a report of the occurrence of the arc fault (S30). On the other hand, when auxiliary determiner 14 determines that an arc fault is not occurring (S29: No), the processing by arc detection device 1 ends. The above series of processes S21 to S30 is then repeated.

Advantages

Advantages of arc detection device 1 according to Embodiment 2 will be described next. Similar to Embodiment 1, arc detection device 1 according to Embodiment 2 can determine whether there is a possibility of an arc fault occurring not only in target power supply line L0, but also in other power supply lines L1 as well. Therefore, arc detection device 1 according to Embodiment 2 has an advantage of being able to detect the occurrence of an arc fault in the plurality of power supply lines L1 branching from DC power source 2. Additionally, similar to Embodiment 1, arc detection device 1 according to Embodiment 2 has an advantage in that because arc detection device 1 only need be provided in one power supply line L1 (target power supply line L0) among the plurality of power supply lines L1, and the location thereof is not limited, there is a high degree of freedom in terms of installation.

Incidentally, voltage V1 applied to target power supply line L0 tends to be attenuated by the drop in voltage caused by current I1 flowing through a resistor present in target power supply line L0. Accordingly, to improve the accuracy of the determination by determiner 12, it is preferable to make the determination by referring not only to the measurement result for voltage V1, but also to the measurement result for current I1 flowing in target power supply line L0. This is because when an arc fault has occurred, or there is a possibility of an arc fault occurring, in target power supply line L0, noise is produced in current I1 flowing in target power supply line L0. Additionally, this is because when an arc fault has occurred, or there is a possibility of an arc fault occurring, in any one of power supply lines L1 aside from target power supply line L0, noise, while minute, can be produced in current I1 flowing in target power supply line L0.

Here, although it is conceivable for determiner 12 to perform frequency analysis on the measurement result for voltage V1 and the measurement result for current I1, respectively, obtained by obtainer 11, doing so tends to increase the operational load. Accordingly, in Embodiment 2, determiner 12 first obtains an instantaneous power supplied to target power supply line L0 by calculating the product of (i) the instantaneous voltage in the measurement result for voltage V1 obtained by obtainer 11 and (ii) the instantaneous current in the measurement result for current I1. Determiner 12 then performs the frequency analysis on the instantaneous power obtained through the calculation. Accordingly, arc detection device 1 according to Embodiment 2 has an advantage in that the operational load can be reduced compared to a case where frequency analysis is performed on the measurement result for voltage V1 and the measurement result for current I1, respectively, obtained by obtainer 11.

OTHER EMBODIMENTS

Although Embodiments 1 and 2 have been described thus far, the present invention is not limited to the foregoing Embodiments 1 and 2. Variations on Embodiments 1 and 2 will be described hereinafter. The variations described hereinafter may be combined with each other as appropriate.

In Embodiments 1 and 2, voltmeter 22 is a device separate from arc detection device 1, but voltmeter 22 may be built into arc detection device 1. Similarly, in Embodiment 2, ammeter 23 is a device separate from arc detection device 1, but ammeter 23 may be built into arc detection device 1.

In Embodiments 1 and 2, arc detection device 1 is provided in DC power source 2, but the configuration is not limited thereto. For example, arc detection device 1 may be connected to power supply line L1 as a device separate from DC power source 2. In this case, if arc detection device 1 is configured to be capable of communicating with DC power source 2 through wired communication or wireless communication, DC power source 2 can be given instructions according to the results of the determination by determiner 12.

Additionally, arc detection device 1 may be connected to any one of branch lines L12 among the plurality of branch lines L12. In this case, attaching the device to the load 3 side has an advantage in that the current flowing in load 3 can be adjusted more easily. For example, connecting arc detection device 1 to branch line L12 makes it easier for auxiliary determiner 14 to make the determination.

In Embodiments 1 and 2, current limiter 13 may temporarily limit the current flowing in each power supply line L1 instead of temporarily stopping the current flowing in each power supply line L1. For example, current limiter 13 may temporarily limit the current flowing in each power supply line L1 to the extent that arc discharge cannot be sustained.

In Embodiment 2, it is difficult to calculate the instantaneous power when current I1 flowing in target power supply line L0 is zero or almost zero. Accordingly, in such a case, similar to Embodiment 1, determiner 12 may determine, based on a component of a specific frequency band in the measurement result for voltage V1 obtained by obtainer 11, whether there is a possibility of an arc fault occurring in the plurality of power supply lines L1.

In Embodiments 1 and 2, arc detection device 1 need not include current limiter 13 and auxiliary determiner 14. In other words, arc detection device 1 may determine whether there is a possibility of an arc fault occurring through a single determination made by determiner 12.

In Embodiments 1 and 2, arc detection device 1 need not include reporter 15.

For example, the present invention can be realized not only as arc detection device 1 and the like, but also as an arc detection method including steps (processes) performed by the constituent elements constituting arc detection device 1.

Specifically, the arc detection method includes obtainment step ST11 and determination step ST12. In obtainment step ST11, a measurement result is obtained for voltage V1 applied to one target power supply line L0 among the plurality of power supply lines L1 to which power is supplied from DC power source 2. In determination step ST12, it is determined, based on a component of a specific frequency band in the measurement result for voltage V1 obtained in obtainment step ST11, whether there is a possibility of an arc fault occurring in the plurality of power supply lines L1.

Additionally, the arc detection method includes obtainment step ST21 and determination step ST22. In obtainment step ST21, a measurement result is obtained for voltage V1 applied to one target power supply line L0 among a plurality of power supply lines L1 to which power is supplied from DC power sources 2, and a measurement result for current I1 flowing in the one target power supply line L0. In determination step ST22, it is determined, based on a component of a specific frequency band of a product of (i) an instantaneous voltage in the measurement result for voltage V1 obtained in obtainment step ST21 and (ii) an instantaneous current in the measurement result for current I1 obtained in obtainment step ST21, whether there is a possibility of an arc fault occurring in the plurality of power supply lines L1.

For example, these steps may be executed by a computer (a computer system) having at least one processor. The present invention can then be implemented as a program for causing a computer to perform the steps included in the method. Furthermore, the present invention can be implemented as a non-transitory computer-readable recording medium, such as a CD-ROM, in which the program is recorded. Specifically, the program causes at least one processor to execute the above-described arc detection method.

Arc detection device 1 according to the foregoing embodiments is implemented through software by a microcomputer, but may also be implemented through software in a general-purpose computer such as a personal computer. Furthermore, arc detection device 1 may be realized through hardware by dedicated electronic circuits constituted by A/D converters, logic circuits, gate arrays, D/A converters, and the like.

Additionally, embodiments achieved by one skilled in the art making various conceivable variations on the embodiments, embodiments achieved by combining constituent elements and functions from the embodiments as desired within a scope which does not depart from the spirit of the present invention, and the like are also included in the present invention.

Conclusion

As described above, arc detection device 1 includes obtainer 11 and determiner 12. Obtainer 11 obtains a measurement result for voltage V1 applied to one target power supply line L0 among a plurality of power supply lines L1 to which power is supplied from DC power source 2. Determiner 12 determines, based on a component of a specific frequency band in the measurement result for voltage V1 obtained by obtainer 11, whether there is a possibility of an arc fault occurring in the plurality of power supply lines L1.

This arc detection device 1 can determine whether there is a possibility of an arc fault occurring not only in target power supply line L0, but also in other power supply lines L1 as well. Therefore, this arc detection device 1 has an advantage of being able to detect the occurrence of an arc fault in the plurality of power supply lines L1 branching from DC power source 2.

Additionally, for example, arc detection device 1 includes obtainer 11 and determiner 12. Obtainer 11 obtains a measurement result for voltage V1 applied to one target power supply line L0 among a plurality of power supply lines L1 to which power is supplied from DC power sources 2, and a measurement result for current I1 flowing in the one target power supply line L0. Determiner 12 determines, based on a component of a specific frequency band of a product of (i) an instantaneous voltage in the measurement result for voltage V1 obtained by obtainer 11 and (ii) an instantaneous current in the measurement result for current I1 obtained by obtainer 11, whether there is a possibility of an arc fault occurring in the plurality of power supply lines L1.

This arc detection device 1 can determine whether there is a possibility of an arc fault occurring not only in target power supply line L0, but also in other power supply lines L1 as well. Therefore, this arc detection device 1 has an advantage of being able to detect the occurrence of an arc fault in the plurality of power supply lines L1 branching from DC power source 2.

Additionally, for example, in arc detection device 1, determiner 12 determines whether there is the possibility of an arc fault occurring in the plurality of power supply lines L1 based on a value normalized to extract the component of the specific frequency band in the measurement result obtained by obtainer 11.

According to this arc detection device 1, the determination can be made while focusing on the amount of change in the measurement result which can arise when there is a possibility of an arc fault occurring, and thus the accuracy of the determination by determiner 12 can be expected to improve.

Additionally, for example, arc detection device 1 further includes current limiter 13 and auxiliary determiner 14. Current limiter 13 temporarily reduces current flowing in the plurality of power supply lines L1 when determiner 12 determines that there is the possibility of an arc fault occurring. Auxiliary determiner 14 determines, after current limiter 13 stops temporarily reducing the current flowing in the plurality of power supply lines L1, whether an arc fault is occurring in the plurality of power supply lines L1.

According to this arc detection device 1, it is easy to prevent an incorrect determination for whether an arc fault is occurring in the plurality of power supply lines L1.

Additionally, for example, in arc detection device 1, auxiliary determiner 14 determines whether the arc fault is occurring in the plurality of power supply lines L1 based on a direct current component in the measurement result for voltage V1 obtained by obtainer 11.

According to this arc detection device 1, the operational load is smaller compared to a case where frequency analysis is performed on the measurement result for voltage V1.

Additionally, for example, in arc detection device 1, the plurality of power supply lines L1 include the plurality of branch lines L12 connected in parallel to branch point P1 and to each of which at least one load 3 is connectable. Arc detection device 1 is connected to any one of the plurality of branch lines L12.

According to this arc detection device 1, attaching the device to the load 3 side has an advantage in that the current flowing in load 3 can be adjusted more easily. For example, according to this arc detection device 1, it is easier for auxiliary determiner 14 to make a determination.

Additionally, for example, arc detection system 100 includes the above-described arc detection device 1, and DC power source 2 which supplies power to the plurality of power supply lines L1.

This arc detection system 100 has an advantage of being able to detect the occurrence of an arc fault in the plurality of power supply lines L1 branching from DC power source 2.

Additionally, for example, the arc detection method includes obtainment step ST11 and determination step ST12. In obtainment step ST11, a measurement result is obtained for voltage V1 applied to one target power supply line L0 among the plurality of power supply lines L1 to which power is supplied from DC power source 2. In determination step ST12, it is determined, based on a component of a specific frequency band in the measurement result for voltage V1 obtained in obtainment step ST11, whether there is a possibility of an arc fault occurring in the plurality of power supply lines L1.

This arc detection method has an advantage of being able to detect the occurrence of an arc fault in the plurality of power supply lines L1 branching from DC power source 2.

Additionally, for example, the arc detection method includes obtainment step ST21 and determination step ST22. In obtainment step ST21, a measurement result is obtained for voltage V1 applied to one target power supply line L0 among a plurality of power supply lines L1 to which power is supplied from DC power sources 2, and a measurement result for current I1 flowing in the one target power supply line L0. In determination step ST22, it is determined, based on a component of a specific frequency band of a product of (i) an instantaneous voltage in the measurement result for voltage V1 obtained in obtainment step ST21 and (ii) an instantaneous current in the measurement result for current I1 obtained in obtainment step ST21, whether there is a possibility of an arc fault occurring in the plurality of power supply lines L1.

This arc detection method has an advantage of being able to detect the occurrence of an arc fault in the plurality of power supply lines L1 branching from DC power source 2.

Additionally, for example, the recording medium is a non-transitory computer-readable recording medium having recorded thereon a program that causes at least one processor to execute the above-described arc detection method.

This recording medium has an advantage of being able to detect the occurrence of an arc fault in the plurality of power supply lines L1 branching from DC power source 2.

The invention claimed is:

1. An arc detection device comprising:
   an obtainer that obtains a measurement result for a voltage applied to one target power supply line among a plurality of power supply lines to which power is supplied from a DC power source; and
   a determiner that, based on a component of a specific frequency band in the measurement result for the voltage obtained by the obtainer, determines whether there is a possibility of an arc fault occurring in the plurality of power supply lines.

2. The arc detection device according to claim 1,
   wherein the determiner determines whether there is the possibility of an arc fault occurring in the plurality of power supply lines based on a value normalized to extract the component of the specific frequency band in the measurement result obtained by the obtainer.

3. The arc detection device according to claim 1, further comprising:
   a current limiter that temporarily reduces current flowing in the plurality of power supply lines when the determiner determines that there is the possibility of an arc fault occurring; and
   an auxiliary determiner that determines, after the current limiter stops temporarily reducing the current flowing in the plurality of power supply lines, whether the arc fault is occurring in the plurality of power supply lines.

4. The arc detection device according to claim 3,
   wherein the auxiliary determiner determines whether the arc fault is occurring in the plurality of power supply lines based on a direct current component in the measurement result for the voltage obtained by the obtainer.

5. The arc detection device according to claim 1,
   wherein the plurality of power supply lines include a plurality of branch lines, each connected in parallel to a branch point and to each of which at least one load is connectable, and
   the arc detection device is connected to any one of the plurality of branch lines.

6. An arc detection system comprising:
the arc detection device according to claim 1; and
the DC power source, the DC power source supplying power to the plurality of power supply lines.

7. An arc detection device comprising:
an obtainer that obtains a measurement result for a voltage applied to one target power supply line among a plurality of power supply lines to which power is supplied from a DC power source, and a measurement result for a current flowing in the one target power supply line; and
a determiner that, based on a component of a specific frequency band of a product of (i) an instantaneous voltage in the measurement result for the voltage obtained by the obtainer and (ii) an instantaneous current in the measurement result for the current obtained by the obtainer, determines whether there is a possibility of an arc fault occurring in the plurality of power supply lines.

8. An arc detection method performed by an arc detection system comprising an obtainer and a determiner, the method comprising:
obtaining, by the obtainer, a measurement result for a voltage applied to one target power supply line among a plurality of power supply lines to which power is supplied from a DC power source; and
determining, by the determiner, based on a component of a specific frequency band in the measurement result for the voltage obtained by the obtainer, whether there is a possibility of an arc fault occurring in the plurality of power supply lines.

9. A non-transitory computer-readable recording medium having recorded thereon a program that causes at least one processor to execute the arc detection method according to claim 8.

10. An arc detection method performed by an arc detection system comprising an obtainer and a determiner, the method comprising:
obtaining, by the obtainer, a measurement result for a voltage applied to one target power supply line among a plurality of power supply lines to which power is supplied from a DC power source, and a measurement result for a current flowing in the one target power supply line; and
determining, by the determiner based on a component of a specific frequency band of a product of (i) an instantaneous voltage in the measurement result for the voltage obtained by the obtainer and (ii) an instantaneous current in the measurement result for the current obtained by the obtainer, whether there is a possibility of an arc fault occurring in the plurality of power supply lines.

\* \* \* \* \*